US008494023B2

(12) United States Patent
Yamazaki et al.

(10) Patent No.: US 8,494,023 B2
(45) Date of Patent: Jul. 23, 2013

(54) COMPOSITE OPTICAL WAVEGUIDE, VARIABLE-WAVELENGTH LASER, AND METHOD OF OSCILLATING LASER

(75) Inventors: Hiroyuki Yamazaki, Tokyo (JP);
Hirohito Yamada, Miyagi (JP)

(73) Assignee: NEC Corporation, Tokyo (JP)

( * ) Notice: Subject to any disclaimer, the term of this patent is extended or adjusted under 35 U.S.C. 154(b) by 84 days.

(21) Appl. No.: 13/015,678

(22) Filed: Jan. 28, 2011

(65) Prior Publication Data

US 2011/0194572 A1 Aug. 11, 2011

(30) Foreign Application Priority Data

Feb. 10, 2010 (JP) ................................. 2010-027852

(51) Int. Cl.
*H01S 3/083* (2006.01)
*H01S 3/03* (2006.01)

(52) U.S. Cl.
USPC .............. 372/94; 372/92; 372/97; 372/98; 372/66

(58) Field of Classification Search
USPC .............. 372/94, 66, 67, 92, 97, 98
See application file for complete search history.

(56) References Cited

U.S. PATENT DOCUMENTS

| | | | | |
|---|---|---|---|---|
| 4,852,117 A * | 7/1989 | Po | ............... | 372/97 |
| 8,005,122 B2 * | 8/2011 | Shimizu | ............... | 372/18 |
| 2004/0037497 A1* | 2/2004 | Lee | ............... | 385/28 |
| 2005/0013537 A1* | 1/2005 | Yamazaki | ............... | 385/27 |
| 2006/0153267 A1* | 7/2006 | Suzuki et al. | ............... | 372/92 |
| 2006/0222038 A1* | 10/2006 | Yamazaki | ............... | 372/94 |
| 2006/0222039 A1* | 10/2006 | Yamazaki | ............... | 372/94 |
| 2007/0036500 A1* | 2/2007 | Suzuki et al. | ............... | 385/129 |
| 2007/0230856 A1* | 10/2007 | Yamazaki | ............... | 385/5 |
| 2008/0056311 A1* | 3/2008 | Takeuchi et al. | ............... | 372/20 |
| 2009/0122817 A1* | 5/2009 | Sato et al. | ............... | 372/20 |
| 2011/0013654 A1* | 1/2011 | Yamazaki | ............... | 372/29.02 |

FOREIGN PATENT DOCUMENTS

| | | |
|---|---|---|
| JP | 2004157530 A | 6/2004 |
| JP | 2005538426 A | 12/2005 |
| JP | 2006329680 A | 12/2006 |
| JP | 2007072433 A | 3/2007 |
| JP | 2009222742 A | 10/2009 |
| WO | 2007029647 A | 3/2007 |

OTHER PUBLICATIONS

Japanese Office Action for JP2010-027852 issued Jan. 25, 2012.
W. M. Green et al., "Ultra-compact, low RF power, 10 Gb/s silicon Mach-Zehnder modulator", Optics Express, vol. 15, No. 25, Dec. 10, 2007, pp. 17106-17113.
H. Nish et al., "Compact and Polarization-Independent Variable Optical Attenuator Based on a Silicon Photonic Wire Waveguicle with Carrier Injection Structure", SSDM2009 Extended Abstract, 1-1-2, 2009, pp. 198-199.

* cited by examiner

*Primary Examiner* — Jessica Stultz
*Assistant Examiner* — Delma R Forde

(57) ABSTRACT

A composite optical waveguide 1 includes a first optical waveguide 9 comprising a silica-based core and a second optical waveguide 11 comprising an Si-based core. The second optical waveguide 11 is joined to the first optical waveguide 9. The length of the first optical waveguide 9 corresponds to a permissible propagation loss of the second optical waveguide 11. The second optical waveguide 11 includes a sharply curved portion 13 having a radius smaller than the minimum bend radius of the first optical waveguide 9.

14 Claims, 9 Drawing Sheets

COMPOSITE OPTICAL WAVEGUIDE, VARIABLE-WAVELENGTH LASER, AND METHOD OF OSCILLATING LASER

This application is based upon and claims the benefit of priority from Japanese patent application No. 2010-027852, filed on Feb. 10, 2010, the disclosure of which is incorporated herein in its entirety by reference.

BACKGROUND

The present invention relates to a composite optical waveguide, a variable-wavelength laser, and a method of oscillating a laser.

As disclosed in JP-A 2004-157530 (Patent Document 1), a silica-based optical waveguide comprising a core of $SiO_2$, SiON, $SiO_x$, or the like and a clad of $SiO_2$ or the like has been established as PLC (Planar Lightwave Circuit) technology because it has a propagation loss as low as 0.01 dB/cm to 0.05 dB/cm and is connectable to a SMF (Single-Mode optical Fiber) or a semiconductor laser (Diode Laser, LD) with a low loss. Such a silica-based optical waveguide has been applied to various optical devices such as an optical branching filter/multiplexer (Arrayed Waveguide Grating, AWG) in a wavelength division multiplex optical communication system and a splitter in FTTH (Fiber To The Home).

Meanwhile, in an Si-based optical waveguide comprising a core of an Si semiconductor or the like and a clad of $SiO_2$ or the like, there is a considerably large difference of the refractive index between the core and the clad. Therefore, the Si-based optical waveguide shows a strong tendency to confine light in the core and has a minimum bend radius of only several micrometers. Accordingly, such an Si-based optical waveguide has prospects for remarkably reducing the size of optical devices.

In fact, an extremely fine AWG or a T-O (Thermo-Optical) optical switch using an Si-based optical waveguide has been produced by way of trial.

Furthermore, since an Si-based optical waveguide comprises a core of semiconductor silicon, it can provide an E-O (Electro-Optical) device by application of an electric field or supply of an electric current.

In fact, an optical modulator using an Si optical waveguide has been produced with use of the above effect by way of trial, as disclosed by William M. Green, Michael J. Rooks, Lidija Sekaric, and Yurii A. Vlasov, "Ultra-compact, low RF power, 10 Gb/s silicon Mach-Zehnder modulator," Optics Express, Vol. 15, Issue 25, (2007) pp. 17106-17113 (Non-Patent Document 1). Furthermore, an optical attenuator has been produced with use of the above effect by way of trial, as disclosed by H. Nishi et al., SSDM2009 Extended Abstract, 1-1-2, (2009) (Non-Patent Document 2).

Patent Document 1 suggests use of a combination of an Si-based optical waveguide and a silica-based optical waveguide.

SUMMARY

However, a silica-based optical waveguide has a minimum bend radius ranging from several hundreds of micrometers to several millimeters, which is much greater than that of an Si-based optical waveguide. Therefore, if a silica-based optical waveguide is used to produce an optical device, the optical device produced has a square of several millimeters up to several centimeters.

Therefore, if an optical integrated circuit is to be produced by using only optical devices of a silica-based optical waveguide, it is difficult to reduce the size of the optical integrated circuit.

Furthermore, as described above, an optical waveguide has been known to have a thermo-optical (T-O) effect in which a refractive index changes by heating and an electro-optical (E-O) effect in which a refractive index changes by application of, an electric field or supply of an electric current. Because a silica-based material has an insulating property, it can provide a thermo-optical (T-O) device but not an electro-optical (E-O) device.

Thus, a silica-based optical waveguide can provide a T-O optical switch having a low speed of response but cannot provide an optical modulator, which is required to have a high speed of response.

In contrast, an Si-based optical waveguide has a minimum bend radius of only several micrometers. However, under the current circumstances, an Si-based optical waveguide has a propagation loss of about 1 dB/cm, which is much higher than that of a silica-based optical waveguide. Therefore, an optical wire using an Si-based optical waveguide cannot be routed longer than an optical wire using a silica-based optical waveguide.

Additionally, an Si-based optical waveguide problematically produces a coupling loss of about 6 dB in a case of direct coupling to an optical fiber. The coupling loss of an Si-based optical waveguide is much higher than that of a silica-based optical waveguide.

Thus, an Si-based optical waveguide has demerits in some characteristics while a silica-based optical waveguide has merits in those characteristics, and vice versa. Under the current circumstances, there is no optical waveguide having merits of both of the optical waveguides.

Patent Document 1 suggests use of a combination of an Si-based optical waveguide and a silica-based optical waveguide. However, Patent Document 1 fails to disclose any specific example of such a combination.

The present invention has been made in view of the above problems. It is, therefore, an object of the present invention to provide an optical waveguide that is smaller in size, produces lower loss, and provides a higher degree of flexibility in design, as compared to a conventional optical waveguide.

In order to attain the above object, according to a first aspect of the present invention, there is provided a composite optical waveguide comprising: a first optical waveguide comprising a silica-based core; and a second optical waveguide comprising an Si-based core, the second optical waveguide being joined to the first optical waveguide, the first optical waveguide having a length corresponding to a permissible propagation loss of the second optical waveguide, the second optical waveguide including a sharply curved portion having a radius smaller than a minimum bend radius of the first optical waveguide.

The length corresponding to a permissible propagation loss of the second optical waveguide refers to a length that is equal to or longer than the length of the second optical waveguide at the time when the second optical waveguide has a permissible maximum insertion loss. For example, assuming that the permissible maximum insertion loss is 0.1 dB and that the propagation loss of the second optical waveguide is 1 dB/cm, the length corresponding to a permissible propagation loss of the second optical waveguide is at least 1 mm.

According to a second aspect of the present invention, there is provided a variable-wavelength laser comprising: a variable-wavelength filter including the composite optical waveguide as recited in the first aspect.

According to a third aspect of the present invention, there is provided a method of oscillating laser, the method comprising: using the variable-wavelength laser as recited in the second aspect.

EFFECTS OF THE INVENTION

According to the present invention, there is provided an optical waveguide that is smaller in size, produces lower loss, and provides a higher degree of flexibility in design, as compared to a conventional optical waveguide.

DETAILED DESCRIPTION OF THE PREFERRED EMBODIMENTS

Preferred embodiments of the present invention will be described below in detail with reference to the accompanying drawings.

First, a structure of a composite optical waveguide 1 according to a first embodiment of the present invention will be summarized with reference to FIGS. 1 to 5.

Figure 1:
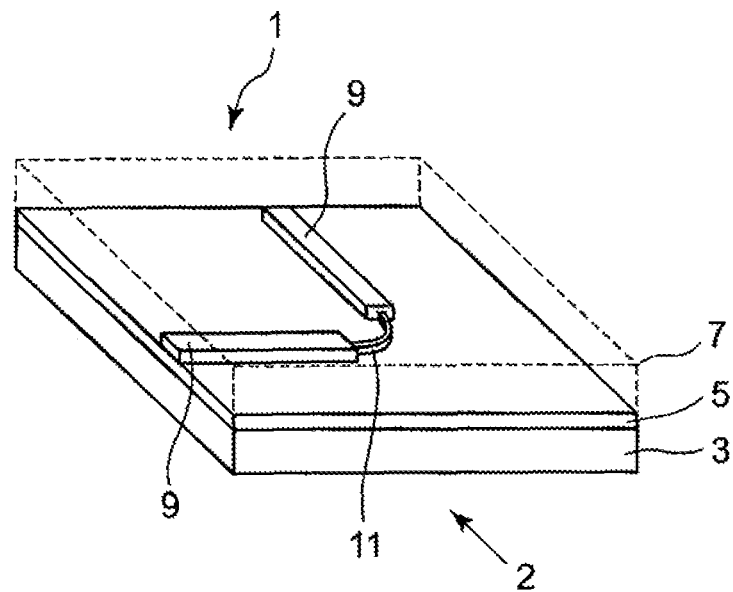
FIG. 1 is a perspective view schematically showing a composite optical waveguide 1 according to a first embodiment of the present invention, in which an overclad layer 7 is illustrated as being transparent with dotted lines indicating its outline.
Figure 2:
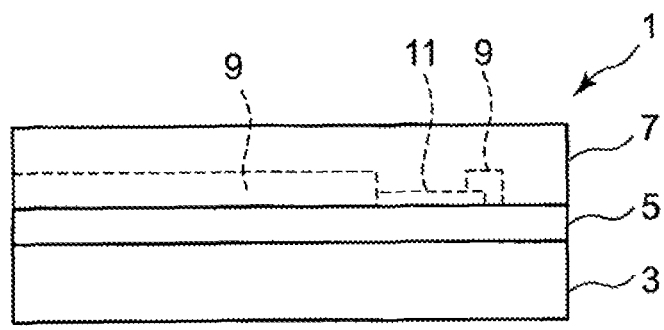
FIG. 2 is a view as seen along arrow 2 of FIG. 1.
Figure 3:
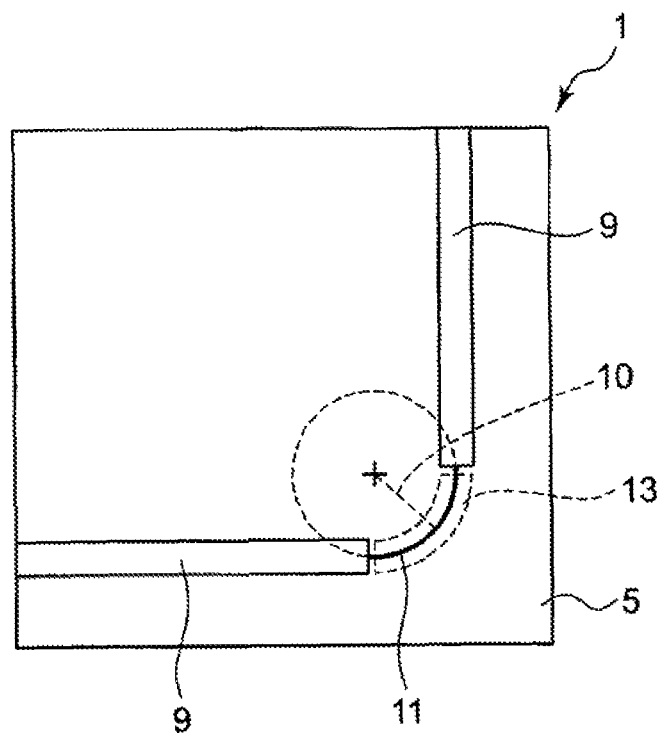
FIG. 3 is a plan view of FIG. 1, from which the overclad layer 7 is omitted.

As shown in FIGS. 1 to 3, the composite optical waveguide 1 includes a substrate 3 formed of Si or the like, an embedment layer 5 (underclad layer) formed of $SiO_2$ or the like on the substrate 3, first optical waveguides 9 (core layer) formed on the embedment layer 5, a second optical waveguide 11 (core layer) formed on the embedment layer 5, and an overclad layer 7 formed of $SiO_2$ or the like on the embedment layer 5 so as to cover the first optical waveguides 9 and the second optical waveguide 11.

Next, the first optical waveguides 9 and the second optical waveguide 11 of the composite optical waveguide 1 will be described in greater detail with reference to FIGS. 1 to 5.

As shown in FIGS. 1 to 3, the composite optical waveguide 1 includes the first optical waveguides 9 and the second optical waveguide 11, which is joined to the first optical waveguides 9.

Figure 4:
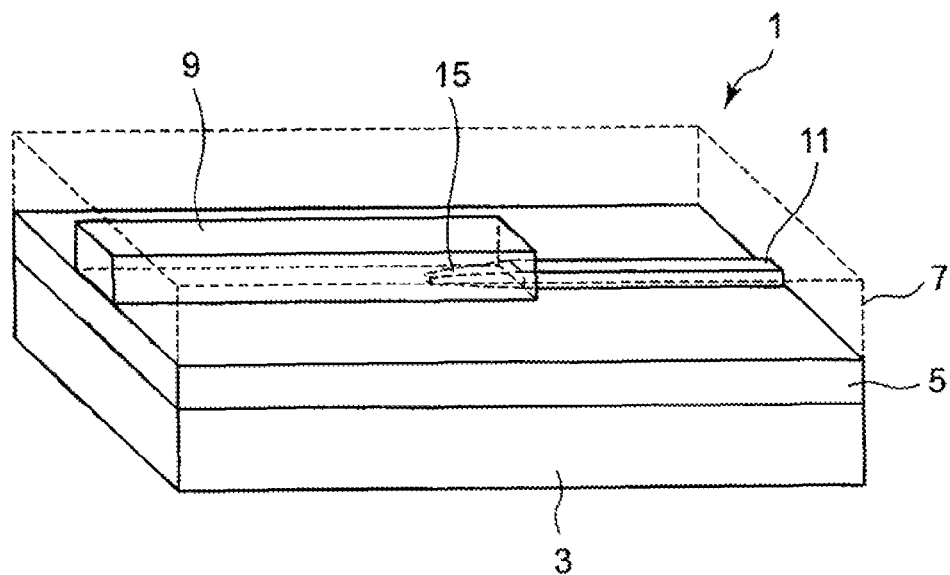
FIG. 4 is an enlarged perspective view of a joint portion of a first optical waveguide 9 and a second optical waveguide 11 of FIG. 1, in which the overclad layer 7 and the first optical waveguide 9 are illustrated as being transparent with dotted lines indicating the outline of the overclad layer 7.
Figure 5:
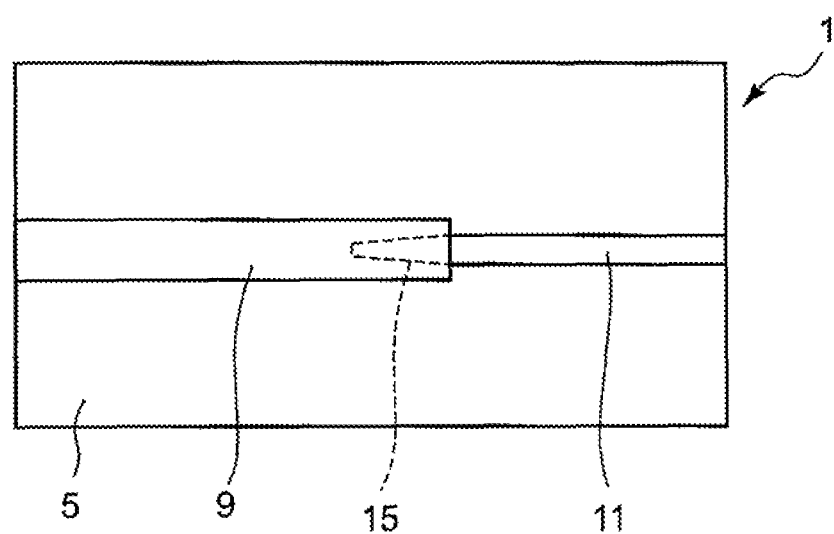
FIG. 5 is a plan view of FIG. 4, from which the overclad layer 7 is omitted.

As shown in FIGS. 4 and 5, the second optical waveguide 11 comprises a tapered portion 15, the width of which is gradually reduced toward its end. The tapered portion 15 is embedded into the first optical waveguide 9.

The material of the first optical waveguides 9 should preferably have a propagation loss as low as possible. The material of the first optical waveguides 9 should preferably have a propagation loss at least lower than that of the material of the second optical waveguide 11.

On the other hand, the material of the second optical waveguide 11 should preferably have a minimum bend radius as small as possible. The material of the second optical waveguide 11 should preferably have a minimum bend radius at least smaller than that of the material of the first optical waveguides 9.

Specifically, the first optical waveguides 9 use a silica-based core including a silica-based material such as $SiO_2$, SiON, or $SiO_x$. The second optical waveguide 11 uses an Si-based core including an Si-based material such as Si semiconductor.

As shown in FIG. 3, the composite optical waveguide 1 comprises a sharply curved portion 13. Specifically, the sharply curved portion 13 has a radius smaller than the minimum bend radius of the material of the first optical waveguides 9 (see the radius 10 of FIG. 3). The second optical waveguide 11 is used at the sharply curved portion 13. In other words, the second optical waveguide 11 includes the sharply curved portion 13.

In order to minimize the propagation loss, the first optical waveguides 9 are used for portions that need to be routed over a long distance. In FIG. 3, the first optical waveguides 9 are used at linear portions, i.e., portions having an infinite radius.

The second optical waveguide 11 may be used at portions connected to heaters 71a and 71b and an electrode 69 in order to exert an electro-optical (E-O) effect or a thermo-optical (T-O) effect, the detail of which will be described later.

Specifically, as described above, a silica-based material has a propagation loss lower than an Si-based material but has a minimum bend radius greater than an Si-based material. Conversely, an Si-based material has a propagation loss higher than a silica-based material but has a minimum bend radius smaller than a silica-based material.

In the composite optical waveguide 1 of the first embodiment, the second optical waveguide 11 comprising an Si-based core is used at a sharply curved portion, and the first optical waveguides 9 comprising a silica-based core are used at portions that need to be routed over a long distance.

Thus, a proper material is used for a waveguide depending upon the shape of a waveguide (the radius of a waveguide in this example) or the length of a waveguide. Therefore, the composite optical waveguide 1 becomes smaller in size, produces lower loss, and provides a higher degree of flexibility in design, as compared to a case in which a single material is used for all waveguides.

Furthermore, the second optical waveguide 11 comprises the tapered portion 15, the width of which is gradually reduced toward its end. The tapered portion 15 is embedded into the first optical waveguide 9.

Accordingly, the composite optical waveguide 1 can be used as a beam spot-size converter (SSC) having a low loss.

Specifically, if a silica-based core is used in the first optical waveguides 9 whereas an Si-based core is used in the second optical waveguide 11, then a coupling loss between the optical waveguides becomes 0.1 dB or less. Therefore, even if those optical waveguides are joined together at about 10 locations, the loss increases only about 1 dB.

Thus, according to the first embodiment, the composite optical waveguide 1 includes the first optical waveguides 9 and the second optical waveguide 11 joined to the first optical waveguides 9. The second optical waveguide 11 is used at the sharply curved portion 13.

Accordingly, the composite optical waveguide 1 becomes smaller in size, produces lower loss, and provides a higher degree of flexibility in design, as compared to a case in which a single material is used for all waveguides.

Next, a second embodiment of the present invention will be described with reference to FIGS. 6 to 10.

In the second embodiment, the composite optical waveguide 1 of the first embodiment is applied to a variable-wavelength laser 101 including a variable-wavelength filter 21 and a semiconductor optical amplifier chip 27.

In the second embodiment, components that have the same function as described in the first embodiment are denoted by the same reference numerals, and the explanation thereof will be omitted herein.

Figure 6:
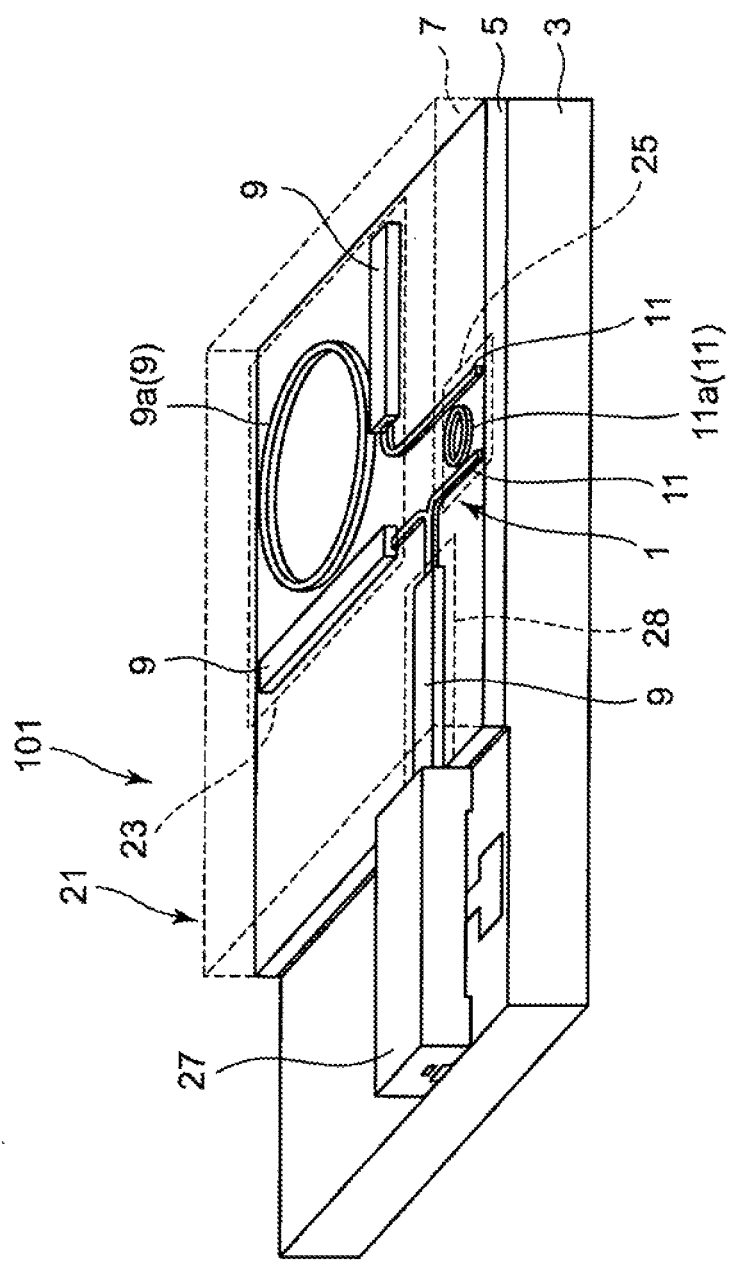
FIG. 6 is a perspective view showing a variable-wavelength laser 101 including the composite optical waveguide 1, in which the overclad layer 7 is illustrated as being transparent with dotted lines indicating its outline.

As shown in FIG. 6, the variable-wavelength laser 101 of the second embodiment comprises a variable-wavelength filter 21 including the composite optical waveguide 1 and a semiconductor optical amplifier (SOA) chip 27.

Figure 7:
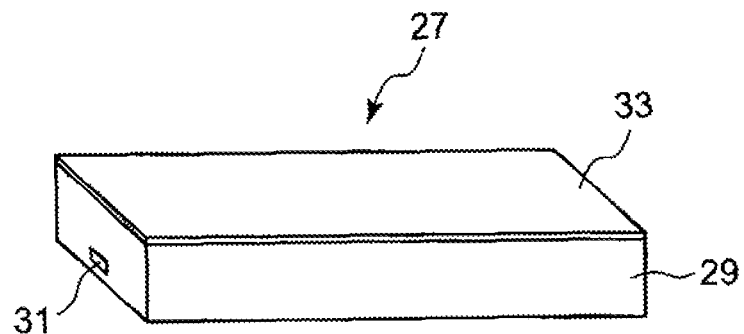
FIG. 7 is an enlarged view of a semiconductor optical amplifier chip 27 of FIG. 6.
Figure 8:
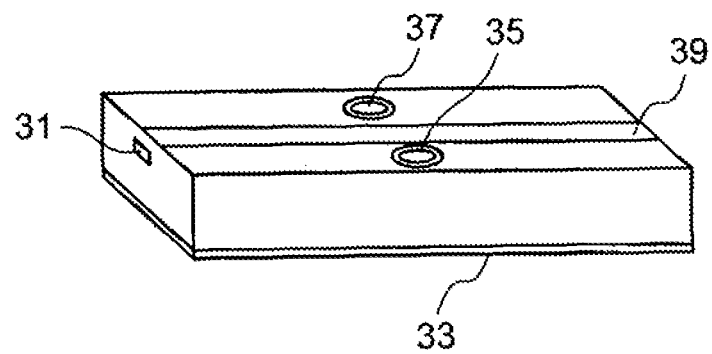
FIG. 8 is a perspective view as seen from a rear face of the semiconductor optical amplifier chip 27 in FIG. 7.

As shown in FIGS. 7 and 8, the semiconductor optical amplifier chip 27 includes a clad 29, an active layer 31 provided within the clad 29, positioning markers 35 and 37 provided on a surface of the clad 29, and electrodes 33 and 39.

Figure 9:
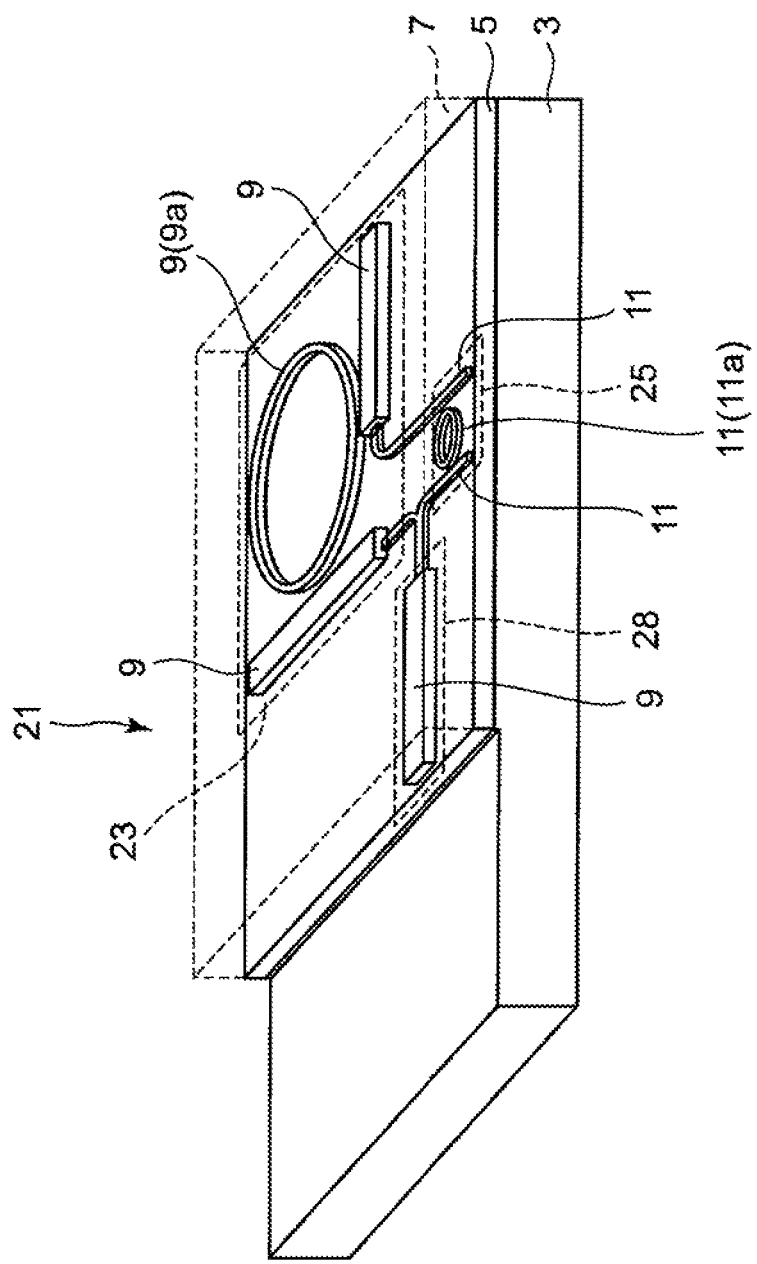
FIG. 9 is a view showing only part relating to a variable-wavelength filter 21 of FIG. 6.

As shown in FIG. 9, the variable-wavelength filter 21 includes a first ring resonator 23, a second ring resonator 25 joined to the first ring resonator 23, and a joint portion 28 joined to the first ring resonator 23 and the second ring resonator 25 so as to join those resonators to the semiconductor optical amplifier chip 27.

The first ring resonator 23 includes a ring 9a having a radius greater than that of the second ring resonator 25. The ring 9a has a circumferential length that is equal to or longer than the length of a waveguide of the second ring resonator 25. The circumferential length of the ring 9a corresponds to a permissible loss of the second ring resonator 25. In other words, the ring 9a has such a large diameter that an excessively high loss is produced if the ring 9a is formed by a waveguide having a high propagation loss, which forms the second ring resonator 25.

Specifically, the first optical waveguides 9 comprising a silica-based core are used in the first ring resonator 23. For example, the ring 9a has a diameter of at least 100 μm.

The second ring resonator 25 is a resonator using a ring 11a having a radius smaller than that of the first ring resonator 23. The radius of the ring 11a is smaller than a minimum bend radius of the material of the first ring resonator 23.

Specifically, the second optical waveguides 11 comprising an Si-based core are used in the second ring resonator 25. For example, the ring 11a has a diameter smaller than 100 μm, preferably not more than several tens of micrometers.

Furthermore, the joint portion 28 is formed by the first optical waveguide 9 comprising a silica-based core.

As with the first embodiment, the first optical waveguides 9 and the second optical waveguides 11 are coupled to each other with a low loss by tapered SSCs.

As is apparent from FIG. 9, the variable-wavelength filter 21 comprises a structure using the composite optical waveguide 1 of the first embodiment. The second optical waveguides 11 comprising an Si-based core are used at sharply curved portions (e.g., the second ring resonator 25). The first optical waveguides 9 comprising a silica-based core are used at portions that need to be routed over a long distance (e.g., the first ring resonator 23). The portions that need to be routed over a long distance refer to portions that need to be routed by a distance equal to or longer than the length of the waveguide that corresponds to a permissible propagation loss of the second optical waveguides 11.

Specifically, the variable-wavelength filter 21 uses the second optical waveguides 11 at portions having a radius smaller than a minimum bend radius of the first optical waveguides 9. The variable-wavelength filter 21 uses the first optical waveguides 9 at portions that need a ring resonator including a ring having a circumferential length that is longer than the length of the waveguide that corresponds to a permissible propagation loss of the second optical waveguides 11.

Thus, the first optical waveguides 9 and the second optical waveguides 11 are used in combination depending upon the bend radius or the length of the waveguides. Therefore, the variable-wavelength filter 21 can be configured to comprise a plurality of ring resonators having a diameter ranging from 10 μm to several millimeters.

Thus, with the composite optical waveguide 1 according to the present invention, it is possible to enhance a degree of flexibility in design of the variable-wavelength filter 21 in the variable-wavelength laser 101.

Furthermore, a combination of a plurality of ring resonators having different diameters allows the variable-wavelength laser 101 to select the wavelength in an effective manner.

Figure 10:
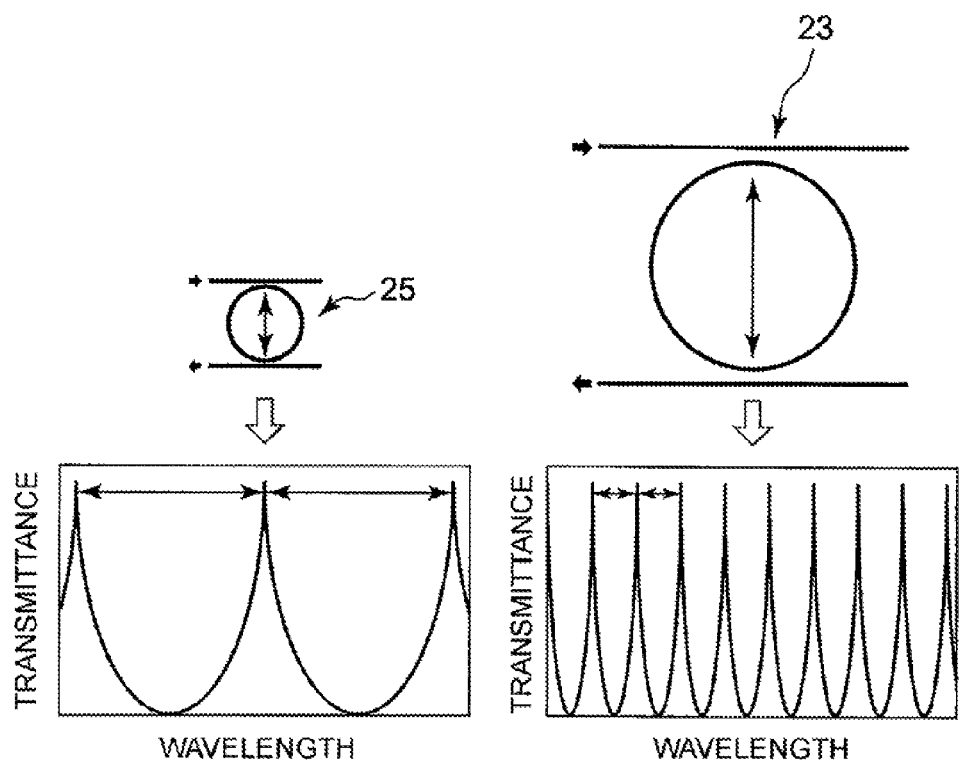
FIG. 10 is a diagram showing the relationship between the radius of a ring resonator and the resonant wavelength intervals (Free Spectral Range, FSR).

Specifically, as shown in FIG. 10, the resonant wavelength intervals (FSR) increase as the diameter of a ring in a ring resonator is reduced. Conversely, FSR decreases as the diameter of a ring is increased.

Therefore, the wavelength can effectively be selected by a combination of a ring having a large diameter and a ring having a small diameter. The variable-wavelength laser 101 can achieve both of a large variable-wavelength width and a continuous oscillation operation.

Furthermore, the variable-wavelength filter 21 uses the first optical waveguide 9 at the joint portion 28. In other words, the first optical waveguide 9 includes the joint portion 28.

This is for the following reasons.

In the variable-wavelength laser 101, it is desirable to couple the variable-wavelength filter 21 to the semiconductor optical amplifier chip 27 with the lowest possible loss. Furthermore, an oscillation operation becomes unstable even if slight light is reflected from a portion at which the variable-wavelength filter 21 is coupled to the semiconductor optical amplifier chip 27, and the reflected light enters the SOA.

Meanwhile, as described above, a high coupling loss is produced if the Si-based second optical waveguide 11 is optically coupled to the semiconductor optical amplifier chip 27. At the same time, the reflection is also developed.

Therefore, for the joint portion 28, it is preferable to use the first optical waveguide 9 comprising a silica-based core, which can achieve a low coupling loss, without using the second optical waveguide 11 comprising an Si-based core.

Thus, according to the second embodiment, the variable-wavelength laser 101 comprises the variable-wavelength filter 21 and the semiconductor optical amplifier chip 27. The variable-wavelength filter 21 includes the composite optical waveguide 1.

Accordingly, it is possible to obtain the same advantageous effects as in the first embodiment.

Furthermore, according to the second embodiment, the variable-wavelength filter 21 of the variable-wavelength laser 101 comprises the second ring resonator 25 including the ring 11a, which has a radius smaller than the first ring resonator 23 and the radius of the ring 9a of the first ring resonator 23. The first ring resonator 23 is formed by the first optical waveguides 9. The second ring resonator 25 is formed by the second optical waveguides 11.

Therefore, the variable-wavelength laser 101 can effectively select the wavelength with the combination of the two ring resonators and can achieve both of a large variable-wavelength width and a continuous stable oscillation operation.

Furthermore, according to the second embodiment, the variable-wavelength filter 21 of the variable-wavelength laser 101 uses the first optical waveguide 9 at the joint portion 28 joined to the semiconductor optical amplifier chip 27.

Therefore, it is possible to minimize the loss and reflection caused by the coupling.

Next, an optical integrated circuit 51 according to a third embodiment of the present invention will be described with reference to FIG. 11.

In the third embodiment, the optical integrated circuit 51 is formed by using the composite optical waveguide 1 of the first embodiment. Thermo-optical (T-O) devices and an electro-optical (E-O) device are provided as a refractive index controller for changing the refractive index with the T-O effect or the E-O effect.

In the third embodiment, components that have the same function as described in the first embodiment are denoted by the same reference numerals, and the explanation thereof will be omitted herein.

Figure 11:
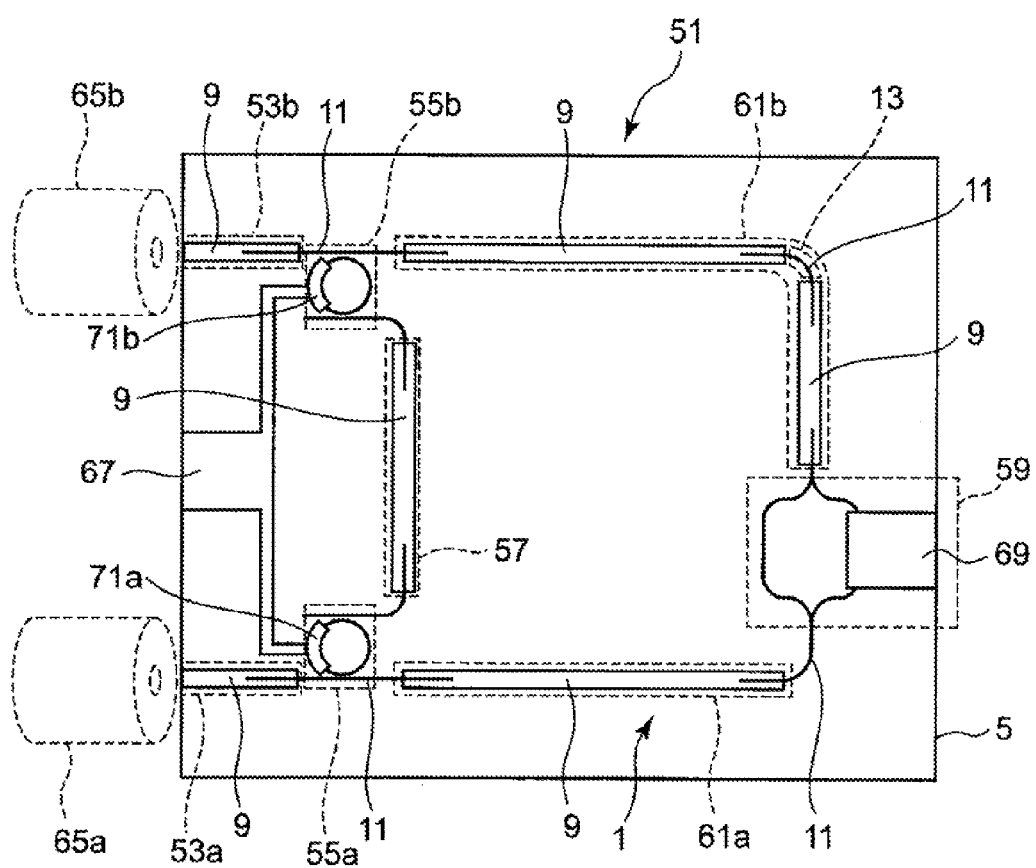
FIG. 11 is a plan view showing an optical integrated circuit 51 including the composite optical waveguide 1, from which the overclad layer 7 and adiabatic grooves 73 are omitted.

As shown in FIG. 11, the optical integrated circuit 51 includes a pair of ring resonators 55a and 55b, an E-O portion 59, joint portions 61a and 61b for joining the ring resonators 55a and 55b to the E-O portion 59, a joint portion 57 for joining the ring resonator 55a and the ring resonator 55b to each other, and external joint portions 53a and 53b for joining the ring resonators 55a and 55b to external optical fibers 65a and 65b (or semiconductor lasers (not shown)).

The ring resonators 55a and 55b include heaters 71a and 71b as thermo-optical (T-O) devices for changing the refractive index of optical waveguides. An electrode 67 is connected to the heaters 71a and 71b for supplying a drive current to the heaters 71a and 71b. The electrode 67 is connected to a power source (not shown).

Specifically, the power source (not shown) supplies a current to the heaters 71a and 71b. Those heaters 71a and 71b heat the ring resonators 55a and 55b, thereby changing the refractive index of the optical waveguides forming the ring resonators 55a and 55b.

The E-O portion 59 includes an electrode 69 as an optical device for changing the refractive index of an optical waveguide. The electrode 69 is connected to another power source (not shown).

Specifically, the power source (not shown) supplies a current to the electrode 69. That electrode 69 applies an electric field to or supplies a current to the optical waveguide, thereby changing the refractive index of the optical waveguide of the E-O portion 59.

In the optical integrated circuit 51, the ring resonators 55a and 55b include the second optical waveguides 11 comprising an Si-based core.

This is because the second optical waveguides 11 comprising an Si-based core can exhibit the thereto-optical effect more effectively than the first optical waveguides 9 comprising a silica-based core. Generally, thermo-optical effect of an Si-based core is greater than the thermo-optical effect of a silica-based core. Thus, the transmission wavelength can be changed to a larger extent by less heat, i.e., by less electric power.

Figure 12:
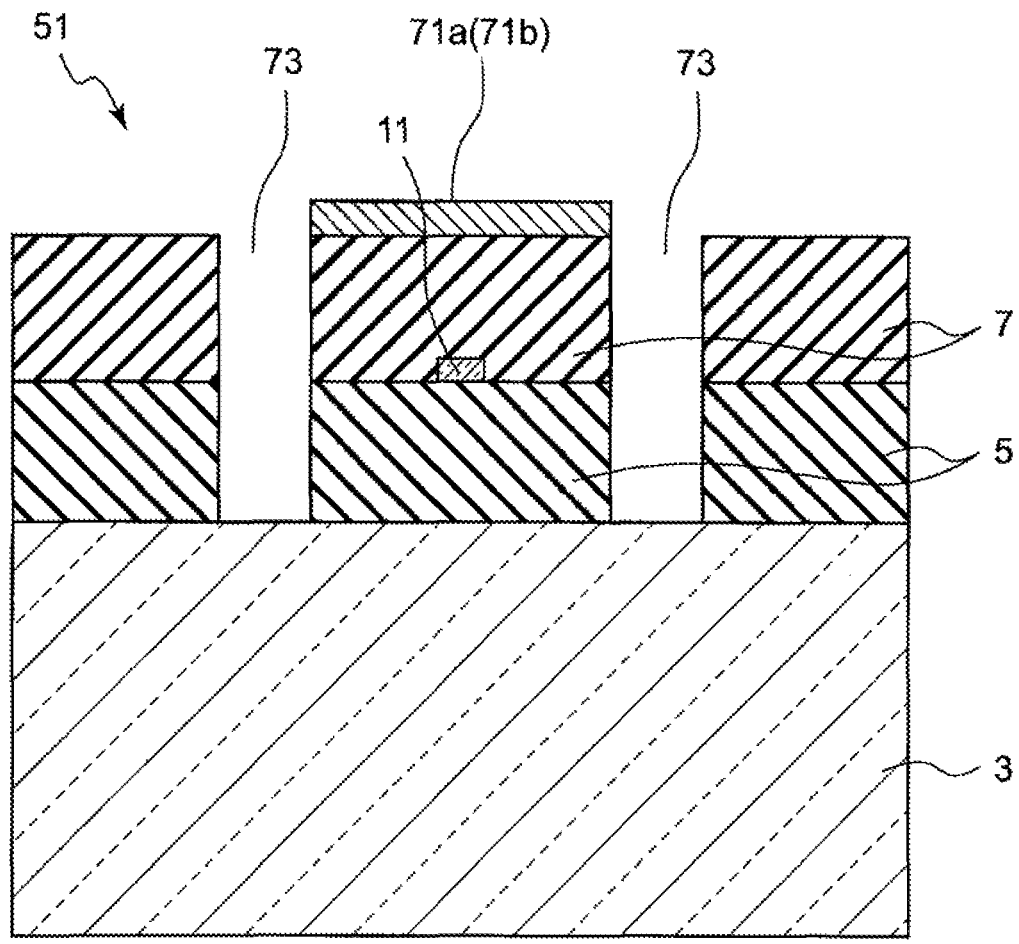
FIG. 12 is an enlarged cross-sectional view near a heater 71a (71b) of FIG. 11.

Furthermore, as shown in FIG. 12, adiabatic grooves 73 are formed around the heaters 71a and 71b by removing the embedment layer 5 and the overclad layer 7.

The adiabatic grooves 73 thus formed effectively confine heat around the second optical waveguide 11. Therefore, the transmission wavelength can be changed to a larger extent by still less electric power. As a result, electric power consumption can be reduced.

Furthermore, the E-O portion 59 includes the second optical waveguides 11 comprising an Si-based core.

This is because the refractive index of a waveguide can be changed by application of an electric field or supply of a current as the cores of the second optical waveguides 11 are formed of Si, which is a semiconductor. The electro-optical effect is responsive at a speed higher than that of thermo-optical effect. Thus, with the E-O portion 59, the wavelength can be changed at a high speed.

Meanwhile, the external joint portions 53a and 53b include the first optical waveguides 9.

This is for the same reasons as described in the second embodiment. Specifically, this is because the coupling loss of the first optical waveguides 9 comprising a silica-based core coupled to the optical fibers 65a and 65b (and/or the semiconductor lasers) is lower than that of the second optical waveguides 11 comprising an Si-based core.

In the joint portions 57, 61a, and 61b, as with the first and second embodiments, the first optical waveguides 9 are used at portions having a radius that is equal to or greater than a minimum bend radius of the material of the first optical waveguides 9 (at linear portions in FIG. 11). The second optical waveguides 11 are used at a sharply curved portion 13, which has a radius smaller than the minimum bend radius of the material of the first optical waveguides 9.

Thus, the second optical waveguides 11 are used at portions at which the T-O effect or the E-O effect is needed. The first optical waveguides 9 are used at portions that need to be joined to the optical fibers 65a and 65b (and/or the semiconductor lasers). In this manner, the first optical waveguides 9 and the second optical waveguides 11 are used in combination. As a result, it is possible to provide an optical integrated circuit 51 that is small in size, produces low loss, and stably operates at a high speed with a low drive power. Such an optical integrated circuit could not be obtained by using only a single type of optical waveguides.

Thus, according to the third embodiment, the optical integrated circuit 51 includes the composite optical waveguide 1.

Accordingly, it is possible to obtain the same advantageous effects as in the first embodiment.

Furthermore, according to the third embodiment, the optical integrated circuit 51 includes the heaters 71a and 71b and the E-O portion 59. The second optical waveguides 11 are used at portions at which the T-O effect or the E-O effect is needed. The first optical waveguides 9 are used at portions that need to be joined to the optical fibers 65a and 65b (and/or the semiconductor lasers).

Therefore, the optical integrated circuit 51 is smaller in size, produces lower loss, and stably operates at a higher speed with a low drive power as compared to a case in which a single type of optical waveguides is used.

The whole or part of the exemplary embodiments disclosed above can be described as, but not limited to, the following supplementary notes.

(Supplementary note 1) A composite optical waveguide comprising: a first optical waveguide comprising a silica-based core; and a second optical waveguide comprising an Si-based core, the second optical waveguide being joined to the first optical waveguide, the first optical waveguide having a length corresponding to a permissible propagation loss of the second optical waveguide, the second optical waveguide including a sharply curved portion having a radius smaller than a minimum bend radius of the first optical waveguide.

(Supplementary note 2) The composite optical waveguide as recited in Supplementary note 1, comprising: a first ring resonator including a ring having a circumferential length longer than a waveguide corresponding to a permissible propagation loss of the second optical waveguide; and a second ring resonator including a ring having a radius smaller than the minimum bend radius of the first optical waveguide, the first ring resonator including the first optical waveguide, the second ring resonator including the second optical waveguide.

(Supplementary note 3) The composite optical waveguide as recited in Supplementary note 2, wherein the ring of the first ring resonator has a diameter of at least 100 μm, and the ring of the second ring resonator has a diameter smaller than 100 μm.

(Supplementary note 4) The composite optical waveguide as recited in Supplementary note 2 or 3, wherein the first optical waveguide includes a portion having a length that is equal to or longer than a diameter of the first ring resonator.

(Supplementary note 5) The composite optical waveguide as recited in any one of Supplementary notes 1 to 4, comprising a refractive index controller provided on the second optical waveguide for changing a refractive index of the second optical waveguide.

(Supplementary note 6) The composite optical waveguide as recited in Supplementary note 5, wherein the refractive index controller includes an electro-optical device operable to change the refractive index of the second optical waveguide with an electro-optical effect.

(Supplementary note 7) The composite optical waveguide as recited in Supplementary note 6, wherein the electro-optical device comprises an electrode for applying an electric field to or supplying an electric current to the second optical waveguide.

(Supplementary note 8) The composite optical waveguide as recited in any one of Supplementary notes 5 to 7, wherein the refractive index controller includes a thermo-optical device operable to change the refractive index of the second optical waveguide with a thermo-optical effect.

(Supplementary note 9) The composite optical waveguide as recited in Supplementary note 8, wherein the thermo-optical device comprises a heater for heating the second optical waveguide.

(Supplementary note 10) The composite optical waveguide as recited in Supplementary note 9, comprising an adiabatic groove formed around the heater for reducing electric power consumption.

(Supplementary note 11) The composite optical waveguide as recited in any one of Supplementary notes 1 to 10, wherein the first optical waveguide includes a joint portion joined to at least one of an optical fiber and a semiconductor laser.

(Supplementary note 12) The composite optical waveguide as recited in any one of Supplementary notes 1 to 11, wherein the silica-based core includes at least one of $SiO_2$, SiON, and $SiO_x$.

(Supplementary note 13) The composite optical waveguide as recited in any one of Supplementary notes 1 to 12, wherein the Si-based core includes an Si semiconductor.

(Supplementary note 14) A variable-wavelength filter comprising: the composite optical waveguide as recited in any one of Supplementary notes 1 to 13.

(Supplementary note 15) A variable-wavelength laser comprising: the variable-wavelength filter as recited in Supplementary note 14.

(Supplementary note 16) A method of oscillating laser, the method comprising: using the variable-wavelength laser as recited in Supplementary note 15.

(Supplementary note 17) An optical integrated circuit comprising: the composite optical waveguide as recited in any one of Supplementary notes 1 to 13.

In the above embodiments, the present invention is applied to the variable-wavelength filter 21, the variable-wavelength laser 101, and the optical integrated circuit 51, respectively. Nevertheless, the present invention is not limited to those examples. The present invention is applicable to any optically functional device that is required to be small in size, to produce low loss, and to stably operate at a high speed with a low drive power.

The present application claims the benefit of priority from Japanese patent application No. 2010-027852, filed on Feb. 10, 2010, the disclosure of whish is incorporated herein in its entirety by reference.

What is claimed is:
1. A composite optical waveguide comprising:
a first optical waveguide comprising a silica-based core,
a second optical waveguide comprising an Si-based core, the second optical waveguide being joined to the first optical waveguide,
a first ring resonator including a ring having a circumferential length longer than a waveguide corresponding to a permissible propagation loss of the second optical waveguide,
a second ring resonator including a ring having a radius smaller than a physical minimum bend radius of the first optical waveguide, and
a joint portion jointed to the first ring resonator and the second ring resonator, and for outputting light with a wavelength selected by the first ring resonator or the second ring resonator,
the first optical waveguide having a length corresponding to the permissible propagation loss of the second optical waveguide,
the second optical waveguide including a sharply curved portion having a radius smaller than the physical minimum bend radius of the first optical waveguide,
the first ring resonator including the first optical waveguide, and
the second ring resonator including the second optical waveguide.

2. The composite optical waveguide as recited in claim 1, wherein the ring of the first ring resonator has a diameter of at least 100 μtm, and
the ring of the second ring resonator has a diameter smaller than 100 μm.

3. The composite optical waveguide as recited in claim 1, wherein the first optical waveguide includes a portion having a length that is equal to or longer than a diameter of the first ring resonator.

4. The composite optical waveguide as recited in claim 1, comprising a refractive index controller provided on the second optical waveguide for changing a refractive index of the second optical waveguide.

5. The composite optical waveguide as recited in claim 4, wherein the refractive index controller includes an electro-optical device operable to change the refractive index of the second optical waveguide with an electro-optical effect.

6. The composite optical waveguide as recited in claim 5, wherein the electro optical device comprises an electrode for applying an electric field to or supplying an electric current to the second optical waveguide.

7. The composite optical waveguide as recited in claim 4, wherein the refractive index controller includes a thermo-optical device operable to change the refractive index of the second optical waveguide with a thermo-optical effect.

8. The composite optical waveguide as recited in claim 7, wherein the thermo optical device comprises a heater for heating the second optical waveguide.

9. The composite optical waveguide as recited in claim 8, comprising an adiabatic groove formed around the heater for reducing electric power consumption.

10. The composite optical waveguide as recited in claim 1, wherein the first optical waveguide includes the joint portion, and the joint portion is joined to at least one of an optical fiber and a semiconductor laser.

11. The composite optical waveguide as recited in claim 1, wherein the silica-based core includes at least one of $SiO_2$, SiON, and $SiO_x$.

12. The composite optical waveguide as recited in claim 1, wherein the Si-based core includes an Si semiconductor.

13. A variable-wavelength laser comprising:
   a variable-wavelength filter including the composite optical waveguide as recited in claim 1.

14. A method of oscillating a laser, the method comprising: using the variable-wavelength laser as recited in claim 13.

* * * * *